(12) United States Patent
Chiang et al.

(10) Patent No.: US 7,361,846 B2
(45) Date of Patent: Apr. 22, 2008

(54) HIGH ELECTRICAL PERFORMANCE SEMICONDUCTOR PACKAGE

(75) Inventors: Wen-Jung Chiang, Taichung Hsien (TW); Chien-Te Chen, Taichung Hsien (TW); Yu-Po Wang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 472 days.

(21) Appl. No.: 10/974,376

(22) Filed: Oct. 26, 2004

(65) Prior Publication Data

US 2005/0253253 A1 Nov. 17, 2005

(30) Foreign Application Priority Data

May 12, 2004 (TW) .............................. 93113299 A

(51) Int. Cl.
*H05K 1/16* (2006.01)
(52) U.S. Cl. ...................................... 174/260; 174/261
(58) Field of Classification Search ................ 174/260, 174/261, 262; 257/784, 690, 734
See application file for complete search history.

(56) References Cited

U.S. PATENT DOCUMENTS

| | | | |
|---|---|---|---|
| 5,153,385 A * | 10/1992 | Juskey et al. ................ 174/260 |
| 5,942,794 A | 8/1999 | Okumura et al. |
| 6,081,029 A | 6/2000 | Yamaguchi |
| 6,191,477 B1 | 2/2001 | Hashemi |
| 6,225,146 B1 | 5/2001 | Yamaguchi et al. |
| 6,229,200 B1 | 5/2001 | Mclellan et al. |
| 6,235,997 B1 * | 5/2001 | Asada et al. ................ 174/260 |
| 6,281,047 B1 | 8/2001 | Wu et al. |
| 6,384,726 B1 | 5/2002 | Epple et al. |
| 6,462,423 B1 * | 10/2002 | Akram et al. ................ 257/778 |

* cited by examiner

*Primary Examiner*—Ishwar (I. B.) Patel
(74) *Attorney, Agent, or Firm*—Peter F. Corless; Steven M. Jensen; Edwards Angell Palmer & Dodge LLP

(57) ABSTRACT

A high electrical performance semiconductor package is proposed. A carrier is provided having a first surface, an opposite second surface, and conductive vias for electrically connecting the first surface to the second surface. A chip is attached to the first surface of the carrier. A plurality of via lands are disposed peripherally on the first surface of the carrier and electrically connected to the vias. A plurality of conductive regions are disposed on the second surface of the carrier and electrically connected to the vias. A plurality of fingers are disposed around the chip and electrically connected to the via lands by conductive traces formed on the first surface of the carrier. A plurality of bonding wires electrically connect the chip to the fingers. Lengths of the wires for transmitting differential pair signals are substantially equal, and lengths of the traces for transmitting the differential pair signals are substantially equal.

13 Claims, 9 Drawing Sheets

HIGH ELECTRICAL PERFORMANCE SEMICONDUCTOR PACKAGE

FIELD OF THE INVENTION

The present invention relates to high electrical performance semiconductor packages, and more particularly, to a high electrical performance land grid array (LGA) semiconductor package for high frequency products.

BACKGROUND OF THE INVENTION

In the semiconductor packaging field, improvement in electrical transmission is always considered as an important factor for advancing the performance of electronic products. For example of the QFN (Quad Flat Non-leaded) technology disclosed in U.S. Pat. Nos. 5,942,794, 6,081,029 and 6,281,047, which improves a conventional lead-frame-based package such as QFP (Quad Flat Package) to allow a bottom surface of the lead frame to be directly exposed and reduce the length of leads of the lead frame, such that signal paths can be shortened and noises are diminished as well as a chip incorporated in the package can be made similar in size to a carrier, thereby facilitating the development of Chip Scale Package (CSP).

FIG. 4 illustrates a cross-sectional view of a QFN package, comprising a die pad 50 and a chip 51 attached to the die pad 50, wherein a plurality of leads 52 are disposed around the die pad 50, and the chip 51 is electrically connected to the leads 52 respectively by bonding wires 53; and an encapsulant 54 for encapsulating the chip 51, with bottom surfaces of the leads 52 and die pad 50 being exposed from the encapsulant 54. The use of such leads 52 eliminates a drawback in electrical performance caused by a conventional lead frame having a plurality of outer leads, simplifies the fabrication processes, and allows this package with advantages in electrical transmission to be applied to a high frequency product such as one employing radio frequency (RF).

However, along with the evolution of high frequency electronic products, the QFN package has encountered bottleneck in terms of electrical performance. This is because for upgrading the performance of the package, the number of I/O (input/output) connections is increased, which requires the leads to be arranged in multiple rows as disclosed in U.S. Pat. Nos. 6,225,146, 6,229,200 and 6,348,726. FIG. 5 shows a cross-sectional view of a package with a three-row arrangement of leads, wherein different sets of bonding wires 53, 53', 53" having different lengths are respectively electrically connected from a chip 51 to different rows of leads 52, 52', 52". This design obviously makes the wires 53" connected to the outmost row of leads 52" be excessively long, leading to an increase in insertion loss and electromagnetic interference. Moreover, since adjacent wires connected to different rows of leads have different lengths (i.e. the wires 53, 53', 53" are different in length), signal transmission paths are different in distance and time for transmitting RF differential pair signals is varied. This greatly affects the electrical performance of high frequency products, and makes the QFN package not suitable for new generation of high frequency electronic products.

In addition, U.S. Pat. No. 6,191,477 has proposed a land grid array (LGA) semiconductor package using a substrate as a carrier, which can be applied to high frequency products as similarly having shortened signal paths. FIG. 6 illustrates a cross-sectional view of such package, wherein the substrate 60 is formed with a plurality of pads 61 located beside conductive vias 62 on an upper surface of the substrate 60, and a plurality of lands 63 located beside the corresponding conductive vias 62 on a lower surface of the substrate 60, such that the number of conductive traces is reduced, and signals can be transmitted directly through the pads 61, the conductive vias 62, and the lands 63 to the outside without requiring the conductive traces.

However, similarly to the QFN packages, for upgrading the performance of the LGA package, the number of I/O connections is increased, which requires the pads 61 and the lands 63 to be disposed in multiple rows, for example, a double-row arrangement of the lands shown in FIG. 7. This results in the same problem of electrical performance for the LGA package. Since a chip 64 is electrically connected to the pads 61, 61' of the two rows respectively by different sets of bonding wires 65, 65' having different lengths as shown in FIGS. 8A and 8B, and is further electrically connected to the lands 63 on the lower surface of the substrate 60 by the conductive vias 62. The wires 65' connected to the outer row of lands 61' are relatively longer and may cause insertion loss and electromagnetic interference. Moreover, due to the different lengths of the adjacent wires 65, 65' connected to different rows of the lands 61, 61', time for transmitting RF differential pair signals is varied, and the signal quality would be degraded, making the LGA package not suitable for new generation of high frequency electronic products.

Therefore, the problem to be solved herein is to provide a novel high electrical performance semiconductor package suitable for high frequency products, which has improved electrical performance and avoids lengthy wires and varied signal transmission time.

SUMMARY OF THE INVENTION

In light of the above drawbacks, an objective of the present invention is to provide a high electrical performance semiconductor package that reduces the length of bonding wires incorporated therein.

Another objective of the present invention is to provide a high electrical performance semiconductor package having equal-length adjacent signal paths and coherent time for transmitting differential pair signals.

Still another objective of the present invention is to provide a high electrical performance semiconductor package that diminishes signal loss and noise interference.

A further objective of the present invention is to provide a high electrical performance semiconductor package that reduces the cost thereof.

In accordance with the above and other objectives, the present invention proposes a high electrical performance semiconductor package, comprising: a carrier having a first surface, a second surface opposite to the first surface, a plurality of conductive vias for electrically connecting the first surface to the second surface; at least one chip attached to the first surface of the carrier; a plurality of via lands disposed on a peripheral area of the first surface of the carrier and electrically connected to the vias; a plurality of fingers disposed around the chip and electrically connected to the via lands by conductive traces formed on the first surface of the carrier; a plurality of bonding wires for electrically connecting the chip to the fingers, wherein lengths of the wires for transmitting differential pair signals are substantially equal, and lengths of the traces for transmitting differential pair signals are substantially equal; and a plurality of conductive regions disposed on the second surface of the carrier and electrically connected to the vias.

The via lands are arranged in multiple rows on the peripheral area of the first surface of the carrier and are located at edges of the vias on the first surface of the carrier. A portion of the fingers are spaced apart from the chip by a substantially constant distance to make the lengths of the wires for transmitting the differential pair signals substantially equal, and a portion of the traces are curved to make the lengths of the traces for transmitting the differential pair signals substantially equal, such that signal transmission paths (i.e. traces) from the fingers to the corresponding via lands are equal in length.

Moreover, the conductive regions are arranged in multiple rows on a peripheral area of the second surface of the carrier and are located close to the vias on the second surface of the carrier. The conductive regions can be lands or ball pads.

Therefore, by the design of the fingers and the traces on the first surface of the carrier, the length of wires can be effectively reduced for a semiconductor package with double or multiple rows of lands, and the wires and traces for transmitting differential pair signals can have equal lengths and/or wire loops, such that the cost on wire bonding is decreased and insertion loss and electromagnetic noise interference are avoided as well as time for transmitting RF differential pair signals is coherent, thereby making the semiconductor package suitable for high frequency products.

BRIEF DESCRIPTION OF DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The preferred embodiment of a high electrical performance semiconductor package proposed in the preset invention is described in detail as follows with references to FIGS. 1 to 3. The signal transmission design of the high electrical performance semiconductor package is to adjust the length of adjacent bonding wires and conductive traces for transmitting differential pair signals (RF paired signals) for a high frequency chip so as to provide a uniform distance between an input terminal and an output terminal and provide different but equal-length transmission paths for the differential pair signals from the chip to the exterior of the package. As a result, the signal transmission time would not be incoherent and the signal quality can be assured no matter whether the package has double-row or multi-row electrical I/O connections.

Figure 1:
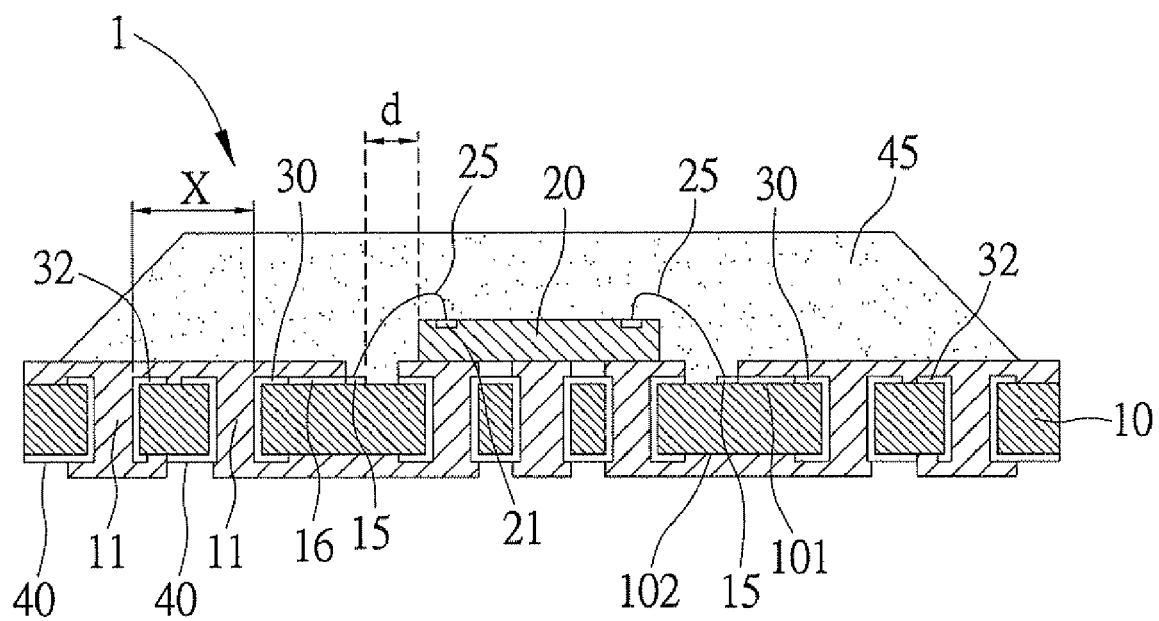
FIG. 1 is a cross-sectional view of a high electrical performance semiconductor package according to a preferred embodiment of the present invention.

Referring to FIG. 1, the high electrical performance semiconductor package 1 according to the present invention comprises a carrier 10, which can be a substrate, having a first surface 101, a second surface 102 opposite to the first surface 101, and a plurality of conductive vias 11 for electrically connecting the first surface 101 to the second surface 102; and a chip 20 attached to the center of the first surface 101 of the carrier 10, which can be a RF high frequency chip. In order to increase the performance of the semiconductor package 1 for use in high frequency products, multiple rows of electrical I/O connections are formed in the semiconductor package 1. As shown in FIGS. 1 and 2B, double rows of first via lands 30 and second via lands 32 of the conductive vias 11 are disposed on the peripheral area of the first surface 101 of the carrier 10. The first via lands 30 and the second via lands 32 are located at edges of the vias 11 and electrically connected to the vias 11.

To solve the problem of electrical performance in the prior art, the present invention provides a plurality of fingers 15 on the first surface 101 of the carrier 10, wherein the fingers 15 are disposed around the chip 20 and substantially spaced apart from the periphery of the chip 20 by a constant distance d. The fingers 15 are each electrically connected to a corresponding first via land 30 or a corresponding second via land 32 by conductive traces 16 formed on the first surface 101 of the carrier 10.

Figure 2A:
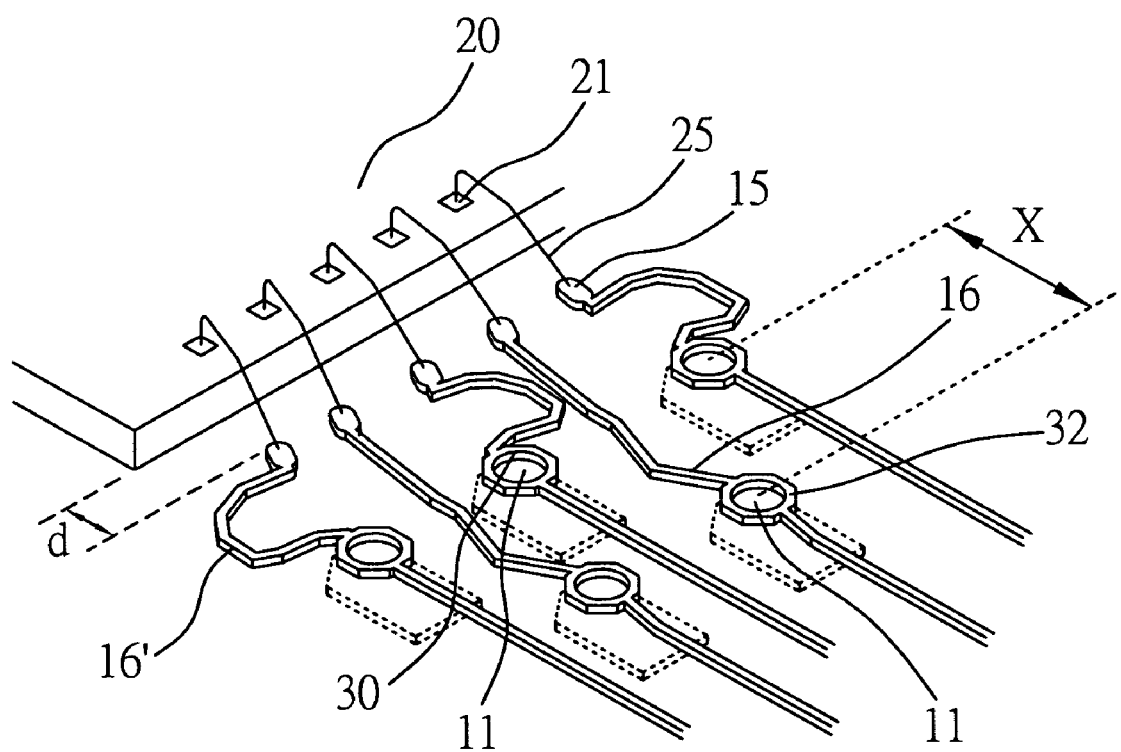
FIG. 2A is a schematic diagram showing circuitry on a first surface of a carrier of the semiconductor package in FIG. 1.
Figure 2B:
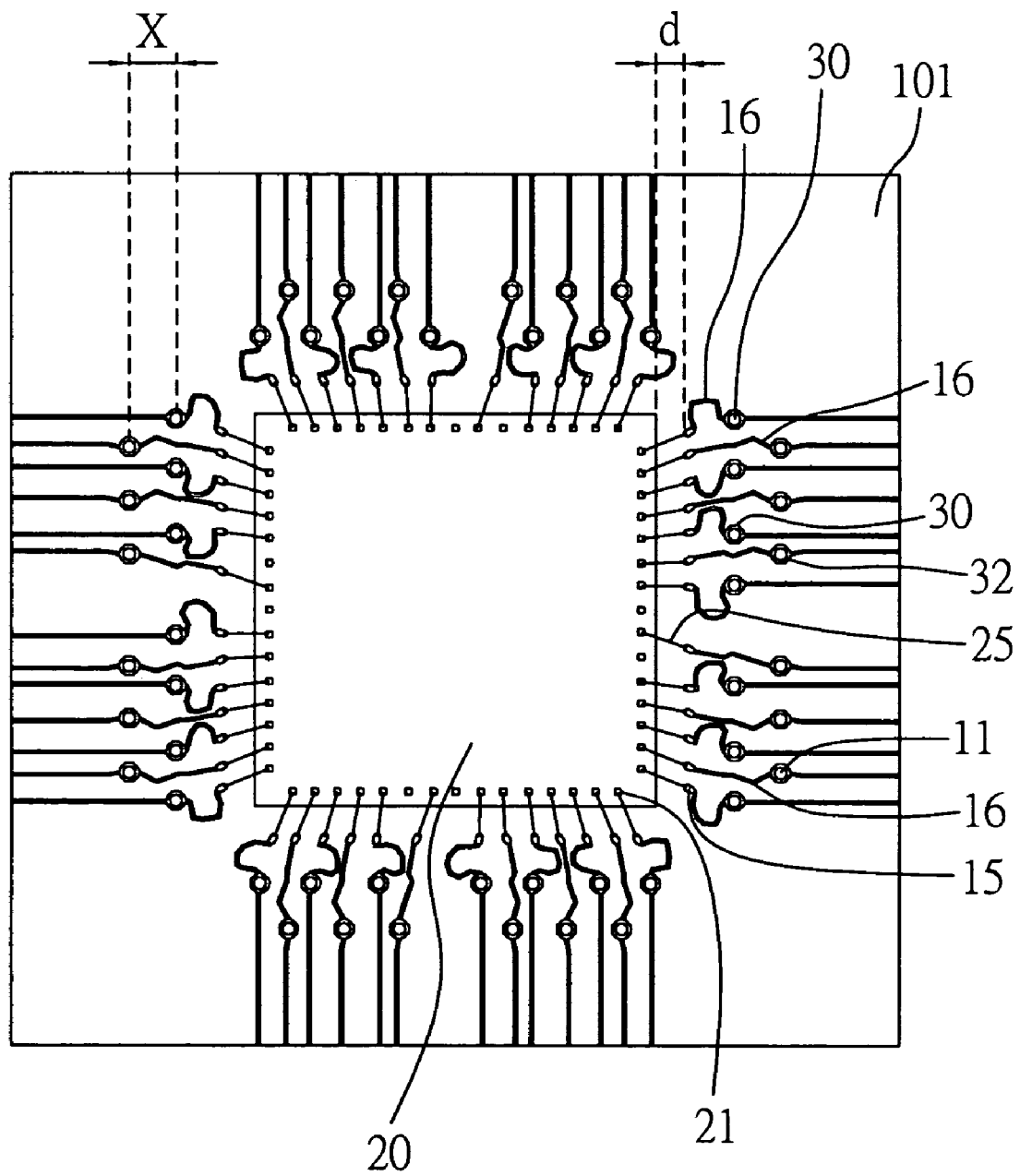
FIG. 2B is a top view of the first surface of the carrier of the semiconductor package in FIG. 1.

Referring to FIGS. 1 and 2A, by provision of the plurality of fingers 15, a conventional wire-bonding process can be performed to form a plurality of bonding wires 25 for electrically connecting the chip 20 to the plurality of fingers 15 around the chip 20. Due to the constant distance d between the fingers 15 and the periphery of the chip 20, each of the fingers 15 is spaced apart from a corresponding bond pad 21 situated on the peripheral area of the chip 20 by a substantially constant distance, making each of the wires 25 have the same length and thus effectively solving the electrical quality problem caused by wires of different lengths. In addition, by the arrangement of the fingers 15 and the traces 16, the fingers 15 can be electrically connected to the relatively farther second via lands 32 without having to alter the length of the wires 25. Unlike the prior art shown in FIG. 8B, which uses longer wires 65' to be connected to the farther pads 61' on the carrier 60, the present invention can eliminate signal loss and electromagnetic interference caused by the longer wires 65' in the prior art.

Referring to FIGS. 2A and 2B, the conductive traces 16 provided on the first surface 101 of the carrier 10 are specially designed for increasing the electrical performance of signal transmission. The traces 16 for connecting the fingers 15 to the first via lands 30 in the inner row are curved so as to allow the length of these traces 16 to be substantially equal to that of the traces 16 for connecting the fingers 15 to the second via lands 32 in the outer row. As a result, the signal transmission path from each finger 15 to the corresponding first via land 30 is substantially equal in length to that from each finger 15 to the corresponding second via land 32. Compared to the prior art, this design can compensate for a distance x in difference between the first via lands 30 of the inner row and the second via lands 32 of the outer row, and thereby solve the problem of incoherent time for transmitting differential pair signals caused by adjacent traces of different lengths. In other words, even though there is a distance x in difference between the first via lands 30 and the second via lands 32, the path and time for transmitting differential pair signals are nearly the same from different fingers 15 to the first via lands 30 or the second via lands 32 in the present invention, which improves the electrical quality of RF paired signals.

Figure 2C:
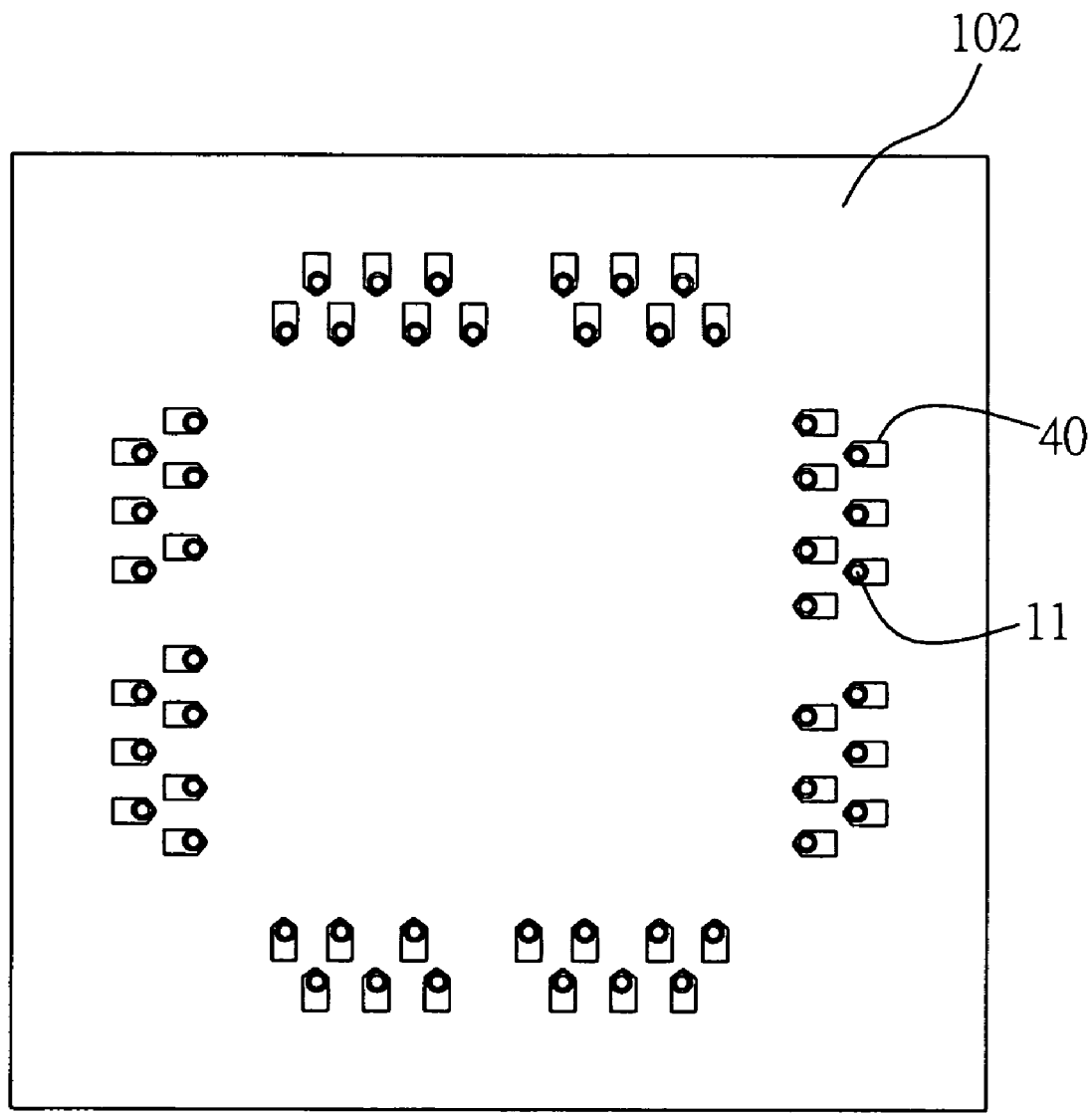
FIG. 2C is a bottom view of a second surface of the carrier of the semiconductor package in FIG. 1.

By the above arrangement, signals of the chip 20 can be transmitted from the bond pads 21 thereof through the wires 25, the fingers 15, and the traces 16 to the first and second via lands 30, 32, and further through the corresponding conductive vias 11 to the second surface 102 of the carrier 10. As shown in FIGS. 1 and 2C, a plurality of conductive regions 40 are disposed on the peripheral area of the second surface 102 of the carrier 10. The conductive regions 40 are located close to the conductive vias 11 and electrically connected to the conductive vias 11, so as to reduce the length of conductive traces on the second surface 102 and shorten the signal transmission paths. The conductive regions 40 can transmit the signals of the chip 20 from the conductive vias 11 to an external electronic device such as a printed circuit board (not shown), thereby achieving signal transmission for a high frequency product. It is to be noted that if the semiconductor package is a LGA package, the conductive regions 40 can be lands; and if the semiconductor package is a BGA (Ball Grid Array) package, the conductive regions 40 can be ball pads, with solder balls being attached to the ball pads.

Furthermore, in the high electrical performance semiconductor package according to the present invention, an encapsulant 45 made of e.g. epoxy resin can be formed on the first surface 101 of the carrier 10 and is used to encapsulate the chip 20, the wires 25, the fingers 15, the traces 16 and the first and second via lands 30, 32, so as to protect these components and assure the quality of electrical transmission.

Figure 8A:
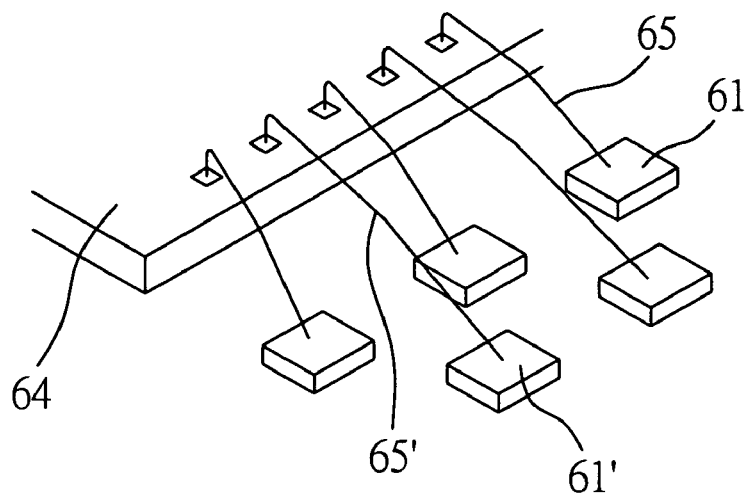
FIG. 8A (PRIOR ART) is a schematic diagram showing circuitry of the conventional package in FIG. 7.
Figure 8B:
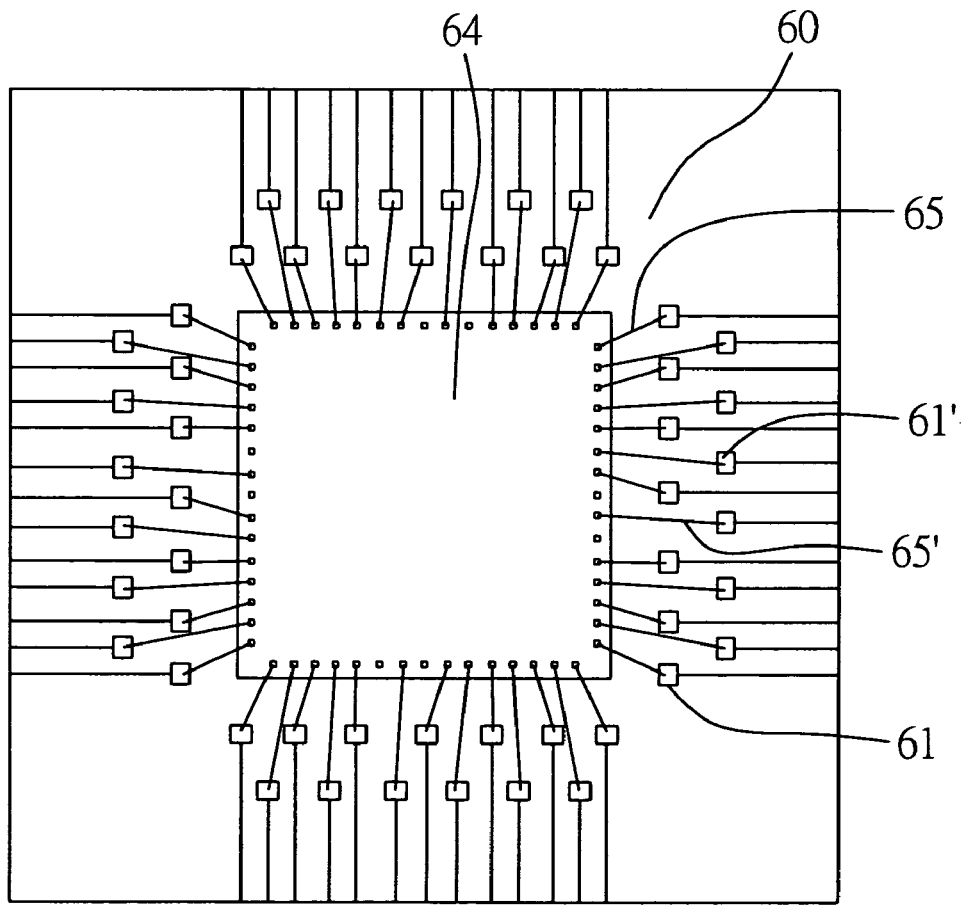
FIG. 8B (PRIOR ART) is a top view of the circuitry of the conventional package in FIG. 7.

Compared to the prior art, for example, comparing FIG. 2A with FIG. 8A and comparing FIG. 2B with FIG. 8B, the arrangement of the fingers 15 situated around the chip 20 and spaced apart from the chip 20 by a substantially constant distance in the present invention can greatly reduce the length of the wires 25 and make each of the wires 25 have equal length and identical wire loop. This not only decreases the cost on wire bonding but also prevents insertion loss and electromagnetic noise interference. Furthermore, as the adjacent traces 16 are made with the same length, the signal transmission paths from the fingers to the inner and outer rows of via lands are thus equal in length, and also the time for transmitting differential pair signals is coherent. This thereby solves the problem of electrical performance in the prior art and meets the requirements for high frequency products.

Figure 3A:
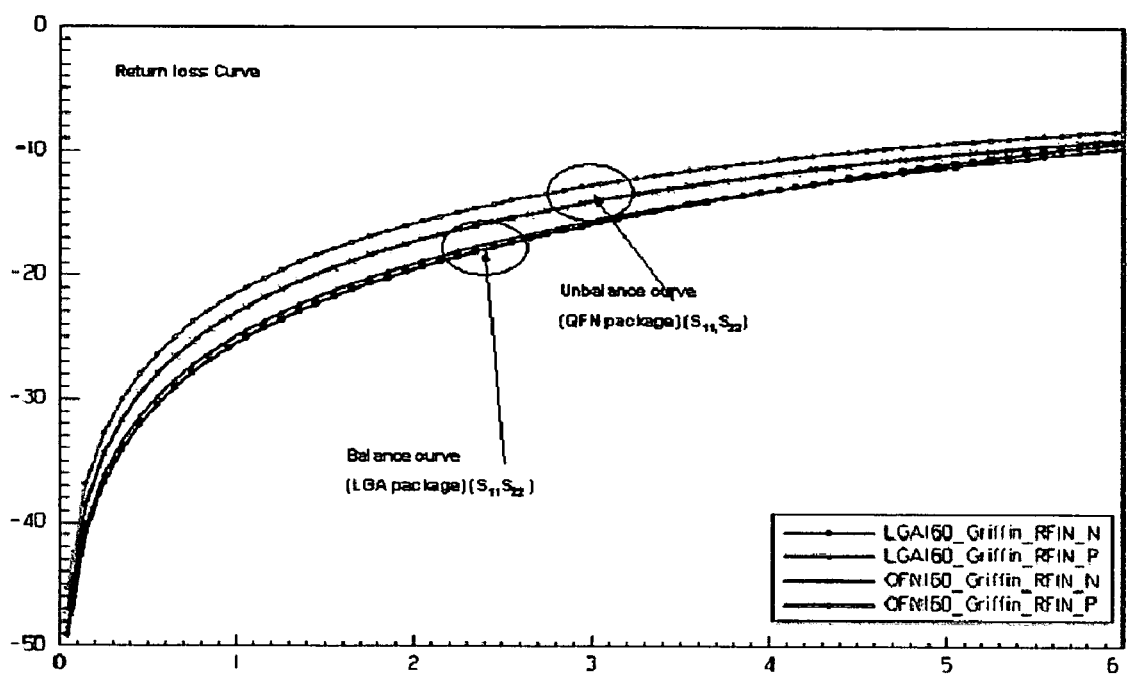
FIGS. 3A to 3D are frequency domain curves of electrical performance simulation of the semiconductor package according to the present invention and a conventional semiconductor package.
Figure 3B:
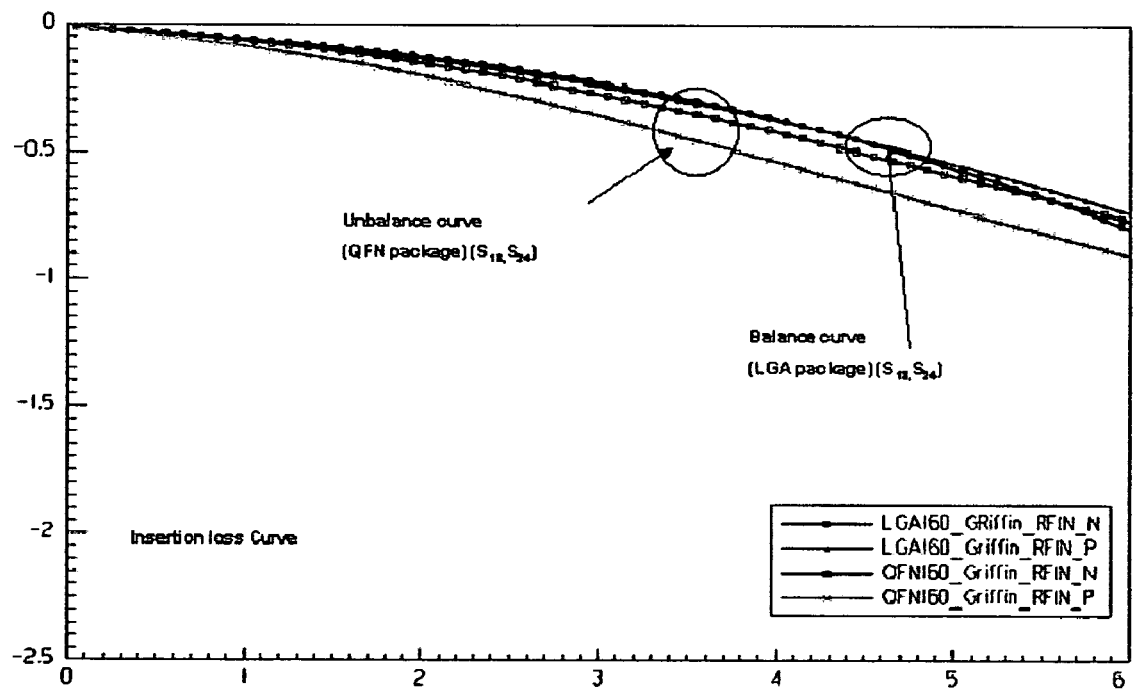
Figure 3C:
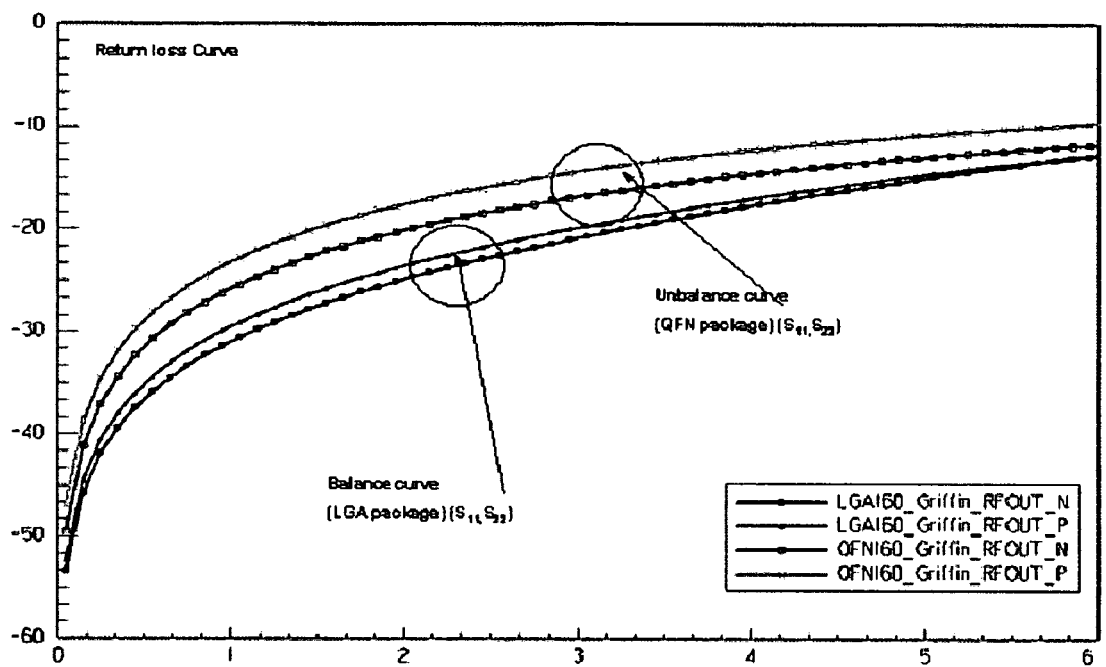
Figure 3D:
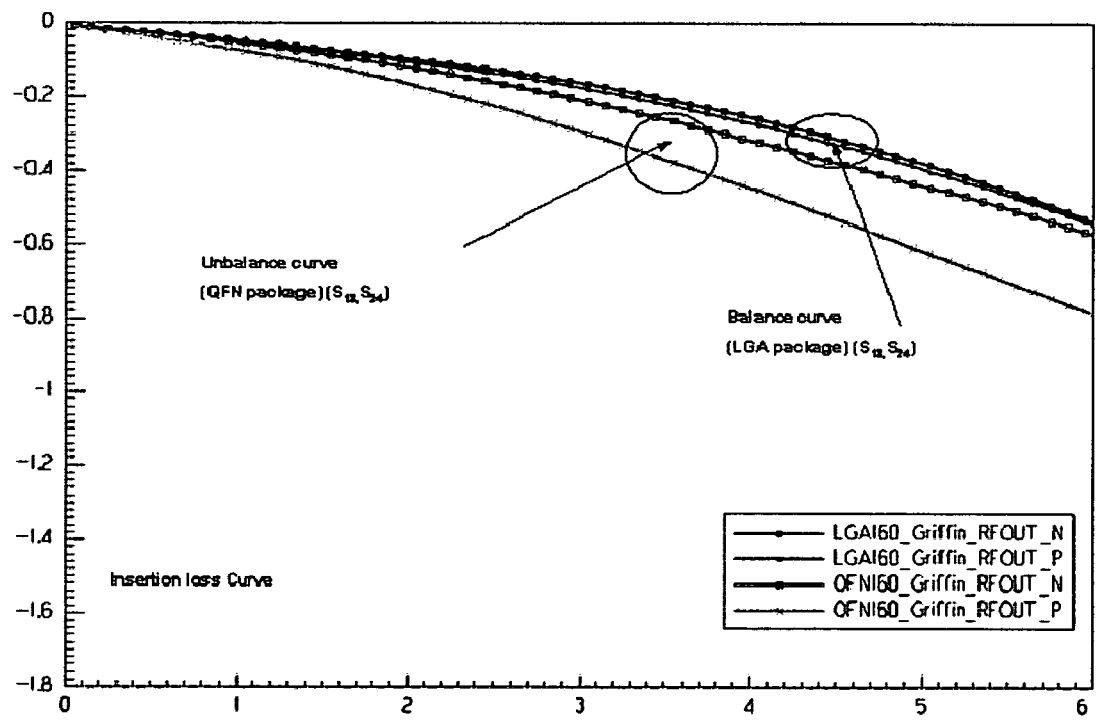
Figure 4:
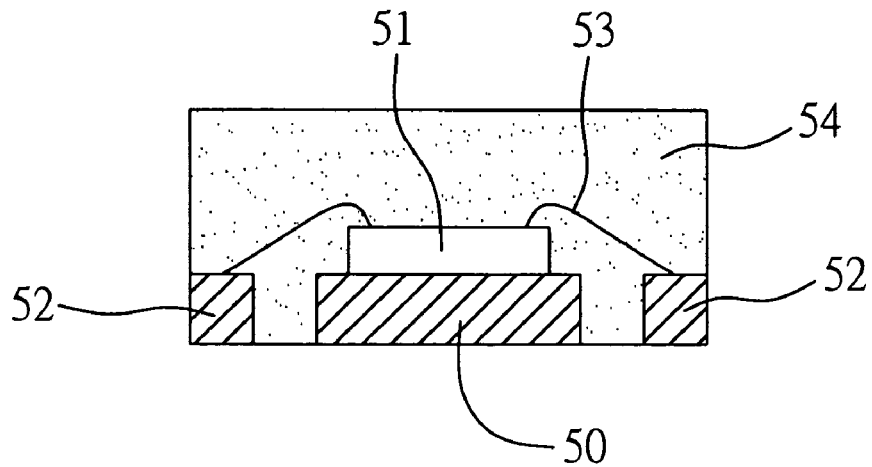
FIG. 4 (PRIOR ART) is a cross-sectional view of a conventional QFN package.
Figure 5:
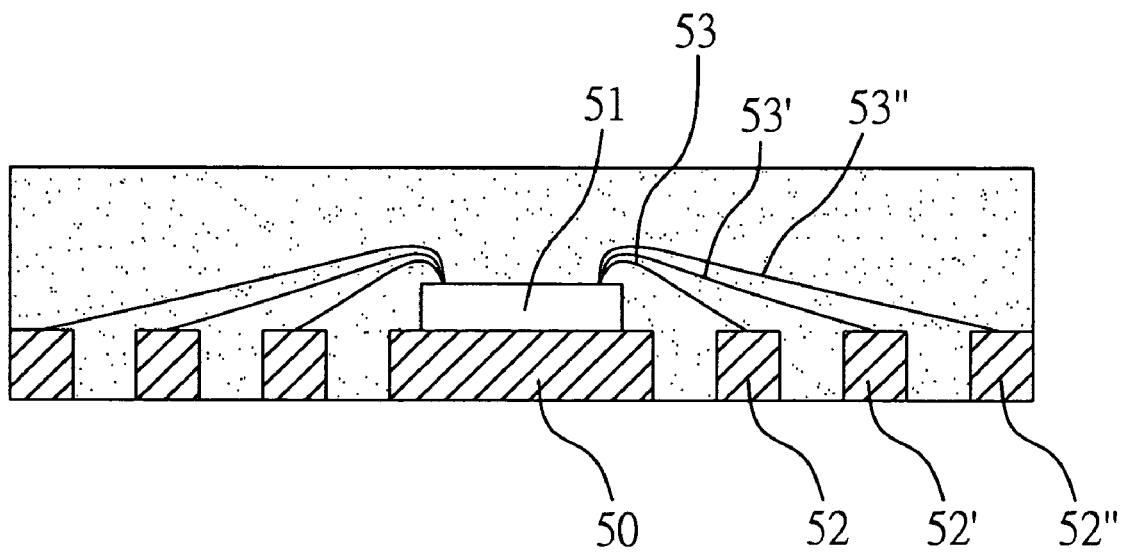
FIG. 5 (PRIOR ART) is a cross-sectional view of a conventional QFN package having multiple rows of lands.
Figure 6:
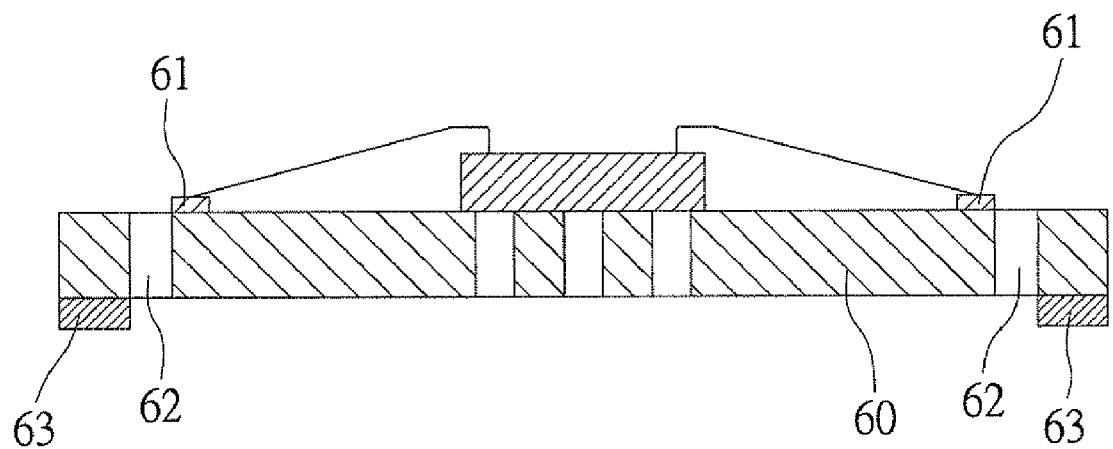
FIG. 6 (PRIOR ART) is a cross-sectional view of a LGA package disclosed in U.S. Pat. No. 6,191,477.
Figure 7:
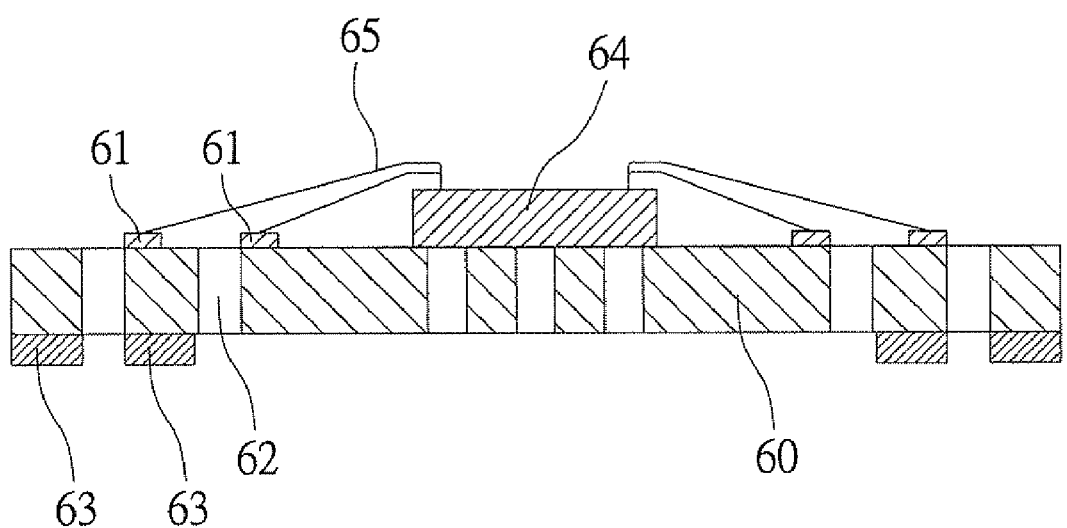
FIG. 7 (PRIOR ART) is a cross-sectional view of a conventional LGA package having multiple rows of lands.

FIGS. 3A to 3D show comparison in electrical performance simulation between the LGA semiconductor package in the present invention and a conventional QFN semiconductor package. FIGS. 3A and 3B are frequency domain curves of return loss and insertion loss respectively when signals are inputted, which indicate that the LGA package in the present invention has smaller return loss and insertion loss and thus has higher electrical quality than the conventional QFN package. FIGS. 3A and 3B also show balance curves in both return loss and insertion loss for different signal transmission paths of the LGA package in the present invention, which indicate that the arrangement of different signal transmission paths in the same length in the present invention allows the time for transmitting differential pair signals to be coherent, and thus the LGA package has higher signal quality. Moreover, FIGS. 3C and 3D illustrate frequency domain curves of return loss and insertion loss respectively when signals are outputted, which show the similar results to those in FIGS. 3A and 3B that the LGA semiconductor package in the present invention can reduce the return loss and insertion loss of the signals and has much higher transmission quality of differential pair signals than that of the conventional QFN package.

The above embodiment is exemplified with double rows of I/O connections on the carrier. It should be understood that the design in the present invention is also suitable for high frequency packages having three or more rows of I/O connections by simply altering the arrangement of conductive traces 16 on the first surface 101 of the carrier 10. This can similarly use a plurality of wires 25 of equal length and identical wire loop, so as to improve the electrical quality and avoid incoherent time for transmitting differential pair signals.

In addition, the above embodiment of the present invention is directed to provision of a constant distance between an input terminal and an output terminal for RF differential pair signals of the chip 20 to allow different but equal-length transmission paths for different pairs of the differential pair signals. This is achieved by making all the wires 25 and all the conductive traces 16 have equal lengths respectively, which merely illustrates a preferred embodiment of the present invention but does not set a limitation on the scope of the present invention. Besides, the present invention can only allow the lengths of adjacent wires 25 and adjacent traces 16 specific for transmitting differential pair signals to be adjusted, so as to provide equal-length signal transmission paths, while other wires and traces not for transmitting differential pair signals can have a conventional arrangement. This also achieves the intended effect of the present invention, and makes the semiconductor package in the present invention applicable to high frequency products having RF paired signals.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed:

1. A high electrical performance semiconductor package, comprising:
   a carrier having a first surface, a second surface opposite to the first surface, and a plurality of conductive vias for electrically connecting the first surface to the second surface;
   at least one chip attached to the first surface of the carrier;
   a plurality of via lands disposed in multiple rows on a peripheral area of the first surface of the carrier and electrically connected to the conductive vias;
   a plurality of fingers disposed around the chip and electrically connected to the corresponding via lands by conductive traces formed on the first surface of the carrier;
   a plurality of bonding wires for electrically connecting the chip to the fingers, wherein lengths of the bonding wires for transmitting differential pair signals are substantially equal, and lengths of the conductive traces for transmitting the differential pair signals are substantially equal; and a plurality of conductive regions disposed on the second surface of the carrier and electrically connected to the conductive vias.

2. The high electrical performance semiconductor package of claim 1, wherein the carrier is a substrate.

3. The high electrical performance semiconductor package of claim 1, wherein the plurality of via lands are located at edges of the conductive vias on the first surface of the carrier.

4. The high electrical performance semiconductor package of claim 1, wherein the plurality of conductive regions are arranged in multiple rows on a peripheral area of the second surface of the carrier.

5. The high electrical performance semiconductor package of claim 1, wherein the plurality of conductive regions are located close to the conductive vias on the second surface of the carrier.

6. The high electrical performance semiconductor package of claim 1, wherein a portion of the fingers are spaced apart from the chip by a substantially constant distance to make the lengths of the bonding wires for transmitting the differential pair signals substantially equal.

7. The high electrical performance semiconductor package of claim 1, wherein a portion of the conductive traces are curved to make the lengths of the conductive traces for transmitting the differential pair signals substantially equal.

8. The high electrical performance semiconductor package of claim 1, wherein all the fingers are spaced apart from the chip by a substantially constant distance.

9. The high electrical performance semiconductor package of claim 1, wherein all the bonding wires are substantially equal in length.

10. The high electrical performance semiconductor package of claim 1, wherein all the conductive traces for electrically connecting the fingers to the via lands are substantially equal in length.

11. The high electrical performance semiconductor package of claim 1, wherein the conductive regions are lands.

12. The high electrical performance semiconductor package of claim 1, wherein the conductive regions are ball pads.

13. The high electrical performance semiconductor package of claim 1, further comprising an encapsulant for encapsulating the chip and the bonding wires.

* * * * *